United States Patent [19]
Kresock

[11] Patent Number: 5,661,436
[45] Date of Patent: Aug. 26, 1997

[54] HIGH BANDWIDTH VIDEO OUTPUT AMPLIFIER CIRCUIT FOR HIGH RESOLUTION CATHODE RAY TUBE IMAGE DISPLAYS

[75] Inventor: John Michael Kresock, Elba, N.Y.

[73] Assignee: Eastman Kodak Company, Rochester, N.Y.

[21] Appl. No.: 636,470

[22] Filed: Apr. 19, 1996

[51] Int. Cl.$^6$ .............................. H03F 3/26; H03F 1/14; H04N 5/14
[52] U.S. Cl. .............................. 330/265; 330/292; 348/707
[58] Field of Search .................... 330/262, 263, 330/265, 266, 267, 271, 272, 273, 292; 348/707

[56] References Cited

U.S. PATENT DOCUMENTS

| | | | |
|---|---|---|---|
| 4,079,337 | 3/1978 | Lundgren et al. | 330/307 |
| 4,091,420 | 5/1978 | Omori et al. | 358/184 |
| 4,118,731 | 10/1978 | Hinn | 358/65 |
| 4,293,875 | 10/1981 | Katz | 358/184 |
| 4,464,636 | 8/1984 | Dobrovolny | 330/300 |
| 4,727,336 | 2/1988 | Mark | 303/267 |
| 4,758,799 | 7/1988 | Ho et al. | 330/311 |
| 4,994,756 | 2/1991 | Brilka | 330/260 |
| 4,999,586 | 3/1991 | Meyer et al. | 348/707 X |
| 5,276,404 | 1/1994 | Asprey et al. | 330/147 |
| 5,343,160 | 8/1994 | Taylor | 330/9 |
| 5,406,221 | 4/1995 | Samani et al. | 330/254 |
| 5,418,495 | 5/1995 | Harvey | 330/265 |
| 5,525,931 | 6/1996 | Mills | 330/263 X |

*Primary Examiner*—Steven Mottola
*Attorney, Agent, or Firm*—Francis H. Boos, Jr.

[57] ABSTRACT

A high bandwidth video output amplifier circuit suitable for driving a cathode ray tube for printing high resolution images on photographic stock with good tonal reproduction includes a high voltage amplifier comprising an emitter follower amplifier with a constant current collector load circuit inputing to an emitter follower buffer current amplifier circuit which drives an output load device such as a cathode ray tube. The constant current collector load provides desired high amplifier gain. A negative feedback path is coupled from the buffer output to the input of the high voltage emitter follower amplifier circuit via an intermediate emitter follower buffer at the input to the voltage amplifier transistor. The feedback provides stable, controlled overall voltage gain and the intermediate buffer amplifier isolates the video input and feedback path from the collector-base Miller capacitance of the voltage amplifier transistor thereby providing a significant extension of the amplifier bandwidth. The voltage amplifier transistors are mechanically mounted on a common dual heat sink to enhance dc operating stability of the overall circuit. The constant current circuit is provided with supplemental base drive during power down operation to maintain a high positive bias voltage on the CRT load device so as to avoid CRT spot burn during collapse of the CRT raster during system turn off.

4 Claims, 1 Drawing Sheet

HIGH BANDWIDTH VIDEO OUTPUT AMPLIFIER CIRCUIT FOR HIGH RESOLUTION CATHODE RAY TUBE IMAGE DISPLAYS

FIELD OF THE INVENTION

The invention relates generally to the field of cathode ray tube video output amplifier circuits.

BACKGROUND OF THE INVENTION

Utra high resolution CRT printers for photographic image printing require video output amplifier circuits capable of producing video output signals with bandwidths of upward of 50 Mhz. Photographic printers also require a very high degree of DC stability in the video output signal because of the extreme sensitivity of photographic media, paper or film, to brightness changes in the image display. One known thick film video output amplifier circuit with the required bandwidth which is commonly used for video monitor applications was found to have a temperature instability characteristic that made it unacceptable for use in a CRT photographic printer application.

There are known techniques for design of video output amplifier circuits with the requisite high bandwidth as well as techniques for design of such circuits with good temperature stability. However, in general, it is difficult to design a single circuit with both characteristics and a compromise in the circuit design is arrived at by applying tradeoffs between achievable bandwidth and stability design characteristics.

There is therefore a need for a high bandwidth video output amplifier circuit, for example a bandwidth of 50 Mhz or higher, that also exhibits the stringent temperature stability characteristics needed to maintain consistent, high quality images reproduced by CRT printing in photographic media, both film and print paper.

SUMMARY OF THE INVENTION

In accordance with the invention, therefore, there is provided a high bandwidth video output amplifier circuit for driving a video output load, wherein the amplifier comprises means including an input resistor for supplying a video input signal and a high voltage gain amplifier circuit including first and second transistors, the second transistor coupled as a constant current collector load to the first transistor. The high bandwidth video output amplifier circuit also includes an emitter follower buffer transistor output circuit coupled to the output of said first transistor for isolating the first transistor from the impedance of said video output load and an emitter follower input buffer transistor having an input terminal coupled to said video input signal supply means and an output terminal coupled to said first transistor for isolating said input signal supply means from collector-base Miller capacitance of said first transistor. The invention circuit further includes a negative feedback path coupled from said emitter follower buffer transistor output circuit to the input terminal of said emitter follower input buffer transistor for providing a controlled overall voltage gain for said high voltage gain amplifier circuit. The isolating function of the emitter follower input buffer transistor increases the bandwidth of the amplifier circuit by avoiding bandwidth rolloff that would occur if the negative feedback path were directly coupled to the base input of the first amplifier transistor thereby being exposed to the collector-base Miller capacitance of the first transistor. The high voltage gain of the first transistor and the negative feedback overcome voltage gain variations caused by temperature variation in the circuit thereby providing DC operating point stability in the output amplifier circuit.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

The single FIGURE of the drawing is a circuit diagram of high bandwidth video output amplifier circuit in accordance with the present invention.

DETAILED DESCRIPTION OF THE INVENTION

Figure 1:
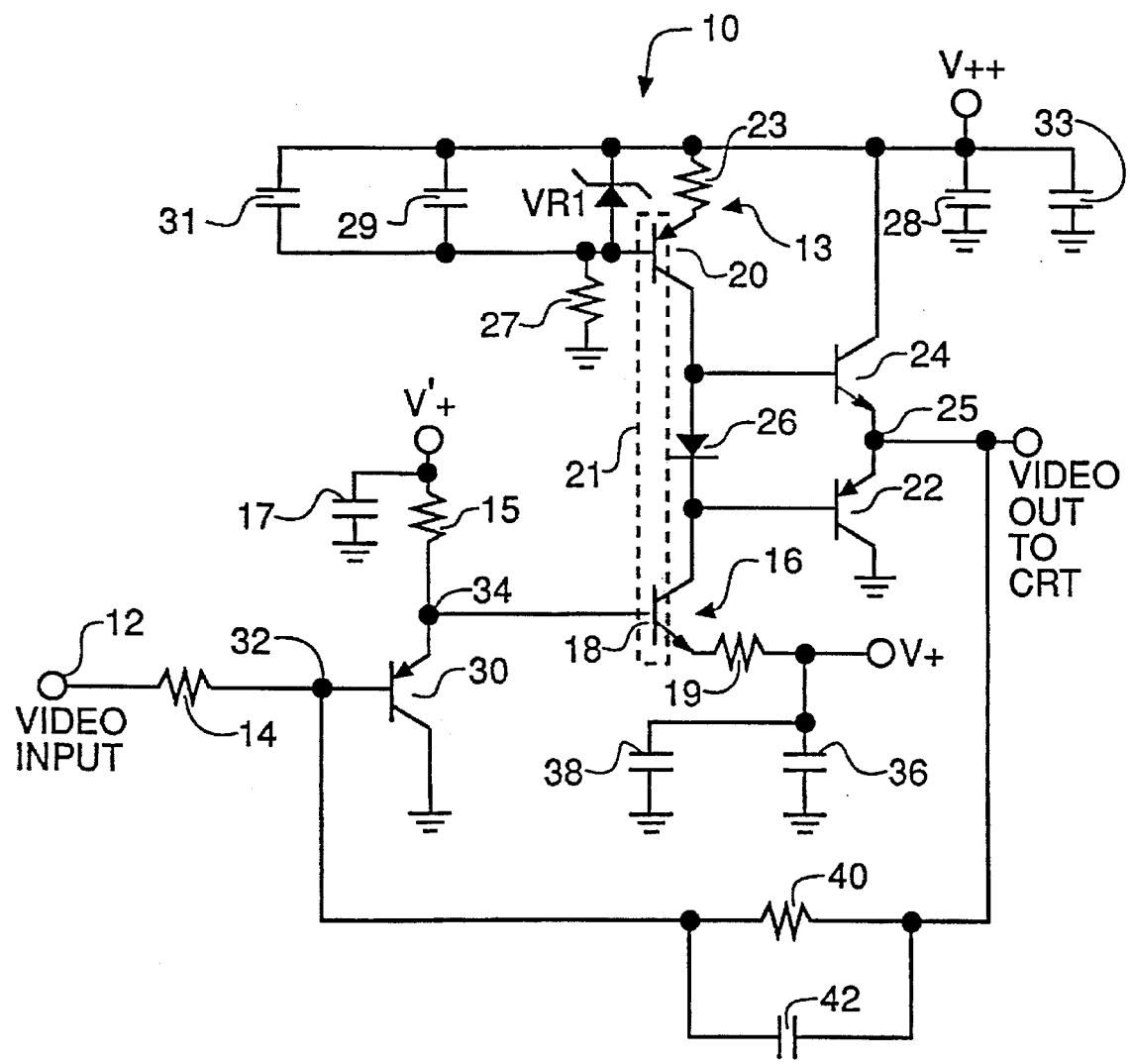

Referring to FIG. 1, a high bandwidth video output amplifier circuit 10 for driving a video output load is shown. Terminal 12 and resistor 14 comprise input means for supplying a video input signal of wide bandwidth on the order of 50 MHz. In a preferred application, the signal is representative of density variations derived from scanning of a photographic image and or from a digital image file and is intended for use by an electronic image reproduction device to produce film or print images of very high resolution.

Output amplifier 10 operates as an inverting amplifier and includes a common emitter voltage amplifier circuit 16 comprising transistors 18 and 20. Transistor 18 serves as the principal voltage amplifier transistor. Emitter resistor 19 sets the overall open loop voltage gain of the output amplifier circuit 10. Transistor 20 is part of a constant current circuit 13 that serves as a high impedance constant current source collector load for transistor 18 to effect the desired high voltage gain of the output amplifier circuit 10. The constant current circuit 13 includes emitter resistor 23 coupled to a voltage source V++. The value of resistor 23 and the base bias on transistor 20 establish the amount of current that the constant current circuit supplies to the voltage amplifier transistor 18. The constant current circuit also includes a voltage reference device VR1 to establish the base bias on transistor 20, in relation to supply V++, and a current supply resistor 27 that provides the base current for transistor 20 and the operating current for the voltage reference device VR1. Capacitors 29 and 31 provide frequency bypassing for the base of transistor 20. Transistors 18 and 20 are preferably mounted on a dual heat sink, represented by dashed line 21, to equalize the junction temperatures of the two transistors thereby improving further the DC operating stability of the circuit.

An emitter follower buffer transistor output circuit, including transistors 22 and 24, serves to isolate the collector circuit of transistor 18 from the impedance of the video output load which may typically be a cathode ray tube display device of known construction. Preferably, the circuit of FIG. 1 is designed to be coupled to the cathode of the CRT device. In the buffer transistor output circuit, transistor 24 conducts on the positive-going signal transitions and transistor 22 conducts on the negative-going transitions. Transistor 24 is normally on except during negative-going signal transitions. As a result, during positive-going transitions there is no turn on delay that would adversely affect the response of the output circuit. Transistor 22, on the other hand, is normally off and during negative-going transitions, transistor 22 undergoes a turn-on delay that adversely affects the transient response of the output circuit. Diode 26 is inserted in the collector circuit of transistor 18 between the bases of transistors 22 and 24 to reduce the turn-on time of transistor 22 thereby improving the transient response of the output amplifier circuit 10 on negative transitions of the video output signal.

Output amplifier 10 also includes an emitter follower input buffer transistor 30 having an input terminal 32 coupled to resistor 14 of the input signal supply means and an output terminal 34 coupled to the base of voltage gain amplifier transistor 18. Buffer transistor 30 serves to isolate the input signal supply means from the collector-base Miller capacitance of the amplifier transistor 18 to provide a significant increase in overall operating bandwidth of the output amplifier 10. For example, if amplifier 10 were constructed without the buffer transistor 30, the bandwidth would be on the order of 30 Mhz. Inclusion of the buffer transistor 30 was found to produce an increase in the bandwidth by a factor of 3 to 1, thereby raising the bandwidth to 90 Mhz.

Resistor 40 and capacitor 42 comprise a negative feedback path coupled from the output terminal 25 of the emitter follower buffer transistor output circuit of transistors 22 and 24 to the input terminal 32 of the emitter follower input buffer transistor 30. This negative feedback path provides a controlled overall voltage gain for the ouput amplifier circuit 10. The gain setting is determined by the ratio of resistor 40 to resistor 14. An exemplary ratio is about 7 to 1. The high voltage gain of transistor 18 and the negative feedback provide a stable amplifier voltage gain that overcomes voltage gain variations caused by temperature variation in the circuit thereby achieving DC operating point stability in the output amplifier circuit 10. The value of capacitor 42 determines the rolloff characteristic of the output amplifier circuit 10 and is chosen to give the maximum stable bandwidth desired for the circuit. A value of about 0.8 picofarad was found suitable for this purpose to achieve the 90 Mhz bandwidth without incurring amplifier instability, e.g. oscillation. Capacitor 42 will include the parasitic capacitance of resistor 40 which may be supplemented with a discrete capacitor component.

Resistor 27 and capacitor 31 of constant current circuit 13 assist in holding voltage reference VR1 in conduction for an extended period of time after power down of the system thereby maintaining constant current in transistor 20 pulling the base voltage of transistor 24 up toward the supply V++ which is reflected to the output by the emitter follower action of transistor 24. A relatively large capacitor 33 is added to supply V++ to maintain the voltage supply level for an extended time period during power down. The interrelated effect of maintaining the voltage supply level V++ up and maintaining the constant current circuit in conduction, thereby holding the output voltage at output terminal 25 near the supply voltage V++ during the period immediately following power down, is to maintain a large positive turn-off bias on the CRT display device during sytem turn-off which suppresses CRT phosphor spot burn as the CRT raster collapses.

By way of example of a presently preferred form of the invention and without being limited thereto, Table I lists values for the components of the embodiment of the invention illustrated in FIG. 1:

TABLE I

| R14 334 Ω | C28 0.1 µf | T18 2SC3423 |
|---|---|---|
| R15 360 Ω | C29 0.1 µf | T20 2SA1360 |
| R19 22.1 Ω | C31 10 µf | T22 2SA1360 |

TABLE I-continued

| R23 71.5 Ω | C33 330 µf | T24 2SC3423 |
|---|---|---|
| R27 60.4K Ω | C36 0.1 µf | T30 2N5771 |
| R40 2200 Ω | C38 10 µf | D26 IN4448 |
| C17 0.1 µf | C42 0.8 pf | V++ +80 vdc |
| | | V'+ +12.6 vdc |
| | | V+ +5 vdc |

The invention has been described with reference to a preferred embodiment. However, it will be appreciated that variations and modifications can be effected by a person of ordinary skill in the art without departing from the scope of the invention.

PARTS LIST 10 high bandwidth video output amplifier circuit
12 input terminal
13 constant current circuit
14 input resistor
15 resistor
16 voltage amplifier circuit
17 capacitor
18 transistor
19 emitter resistor
20 transistor
21 dual heat sink
22 emitter follower buffer output transistor
23 emitter resistor
24 emitter follower buffer output transistor
25 buffer circuit output terminal
26 bias diode
27 current supply resistor
28 capacitor
29 capacitor
30 emitter follower input buffer transistor
31 capacitor
32 input terminal
33 capacitor
34 input buffer transistor output terminal
36 capacitor
38 capacitor
40 resistor
42 capacitor

What is claimed is:

1. High bandwidth video output amplifier circuit for driving a video output load, the amplifier comprising:
    means including an input resistor for supplying a video input signal;
    a voltage amplifier circuit having high voltage gain including first and second transistors, the second transistor coupled as a constant current collector load to the first transistor;
    an emitter follower buffer transistor output circuit coupled to the output of said first transistor for isolating the first transistor from the impedance of said video output load;
    an emitter follower input buffer transistor having an input terminal coupled to said video input signal supply means and an output terminal coupled to said first transistor for isolating said input signal supply means from collector-base Miller capacitance of said first transistor; and
    a negative feedback path coupled from said emitter follower buffer transistor output circuit to the input terminal of said emitter follower input buffer transistor for providing a controlled overall voltage gain for said voltage amplifier circuit.

2. The video output amplifier circuit of claim 1 wherein the output amplifier circuit is adapted to drive a cathode ray tube display device and wherein said constant current collector load comprises a constant current source circuit including said second transistor, a voltage reference device for providing base bias for said second transistor, a current source resistor for providing base current to said second transistor and operating current to said voltage reference device, a voltage supply for said second transistor, said voltage supply having means for maintaining said supply voltage for an extended time after power down, and capacitance means to assist in holding said voltage reference device in conduction for said extended period of time after power down;

whereby said current source resistor and said capacitance provide an interrelated effect of holding output voltage of the output amplifier near the extended supply voltage so as to maintain a large beam cutoff bias on said cathode ray tube during power down to suppress phosphor spot burn.

3. The video output amplifier circuit of claim 1 wherein said first and second transistors of the voltage amplifier circuit are mounted on a common heat sink to equalize junction temperatures of the two transistors thereby improving DC operating stability of the output amplifier circuit.

4. The video output amplifier circuit of claim 1 wherein said buffer transistor output circuit includes third and fourth emitter-connected transistors having respective bases connected to the collector load of said first transistor and a diode connected in the collector load of said first transistor between the bases of said third and fourth transistors to reduce turn-on time of said fourth transistor to thereby improve transient response of the output amplifier circuit.

* * * * *